(12) United States Patent
Coimbra et al.

(10) Patent No.: US 11,733,277 B2
(45) Date of Patent: Aug. 22, 2023

(54) CIRCUITS AND METHODS FOR VOLTAGE MEASUREMENT

(71) Applicant: NXP B.V., Eindhoven (NL)

(72) Inventors: Ricardo Pureza Coimbra, Campinas (BR); Edevaldo Pereira da Silva, Jr., Austin, TX (US); Felipe Ricardo Clayton, Campinas (BR)

(73) Assignee: NXP B.V., Eindhoven (NL)

( * ) Notice: Subject to any disclaimer, the term of this patent is extended or adjusted under 35 U.S.C. 154(b) by 71 days.

(21) Appl. No.: 17/643,052

(22) Filed: Dec. 7, 2021

(65) Prior Publication Data

US 2023/0176097 A1 Jun. 8, 2023

(51) Int. Cl.
*H03M 1/12* (2006.01)
*G01R 19/257* (2006.01)

(52) U.S. Cl.
CPC ........ *G01R 19/257* (2013.01); *H03M 1/1245* (2013.01)

(58) Field of Classification Search
CPC .................................................. H03M 1/1245
USPC ........................................................ 341/155
See application file for complete search history.

(56) References Cited

U.S. PATENT DOCUMENTS

| 4,364,028 A | * | 12/1982 | Masuda | ............... H03M 1/0602 341/118 |
| 5,027,117 A | * | 6/1991 | Yoshida | ................... H04N 1/40 341/158 |
| 5,440,305 A | | 8/1995 | Signore et al. | |
| 8,665,130 B2 | | 3/2014 | Makinwa et al. | |
| 8,915,646 B2 | | 12/2014 | Wei et al. | |
| 9,506,817 B2 | | 11/2016 | Qiu | |
| 2016/0053705 A1 | * | 2/2016 | Goto | ..................... H03M 1/181 324/120 |

* cited by examiner

*Primary Examiner* — Peguy Jean Pierre

(57) ABSTRACT

An integrated circuit includes an analog-to-digital converter (ADC) configured to receive input voltage, and first and second reference voltages, and outputs digital code representing ratios between the input voltage and the first and the second reference voltages. The first and second reference voltages are generated by a reference generator using different current densities. During a first stage, the ADC samples the first input voltage and the first reference voltage and transfers equivalent charge of the sampled first input voltage and first reference voltage to an integration capacitor. During a second stage, the ADC samples the second reference voltage and transfers equivalent charge of the sampled second reference voltage to the integration capacitor. The ADC provides one bit of digital code based on total charge stored on the integration capacitor after the transfers of charge of the sampled input voltage, and the sampled first and second reference voltages.

20 Claims, 16 Drawing Sheets

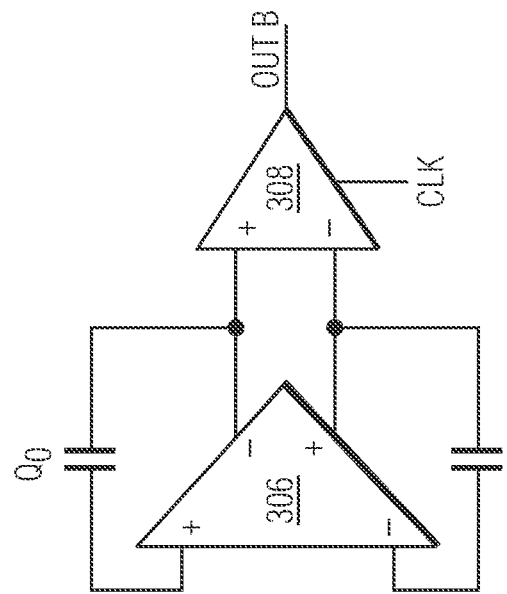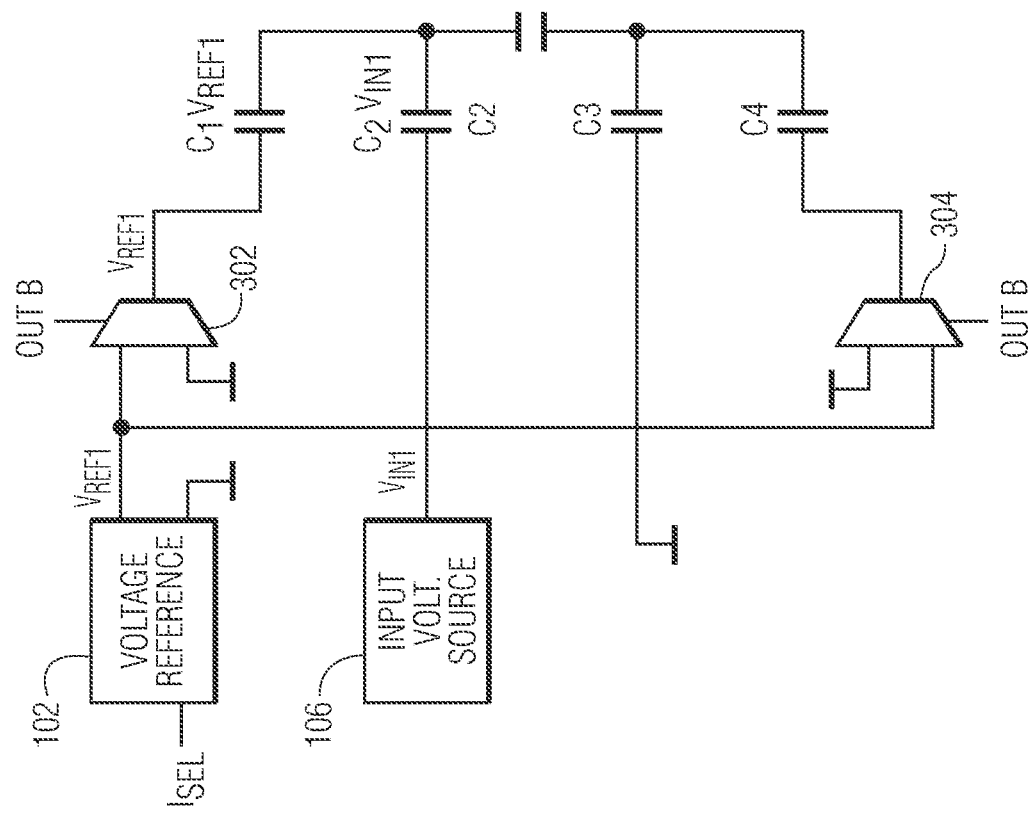
FIG. 5

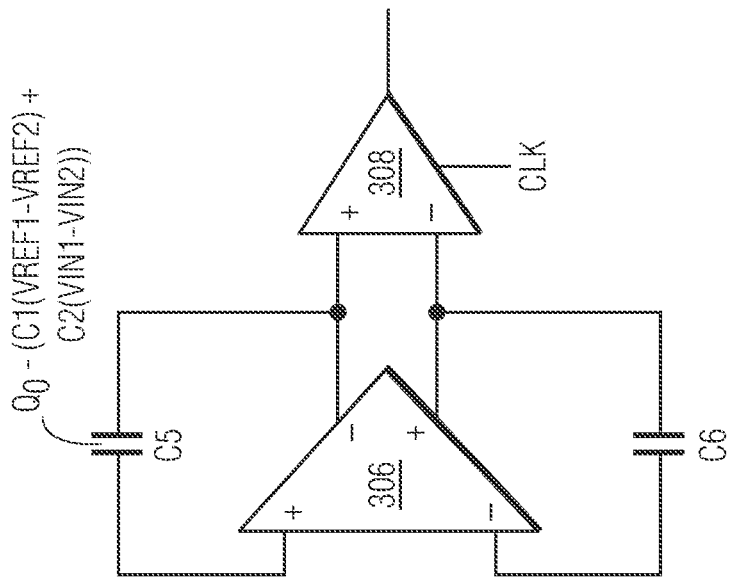
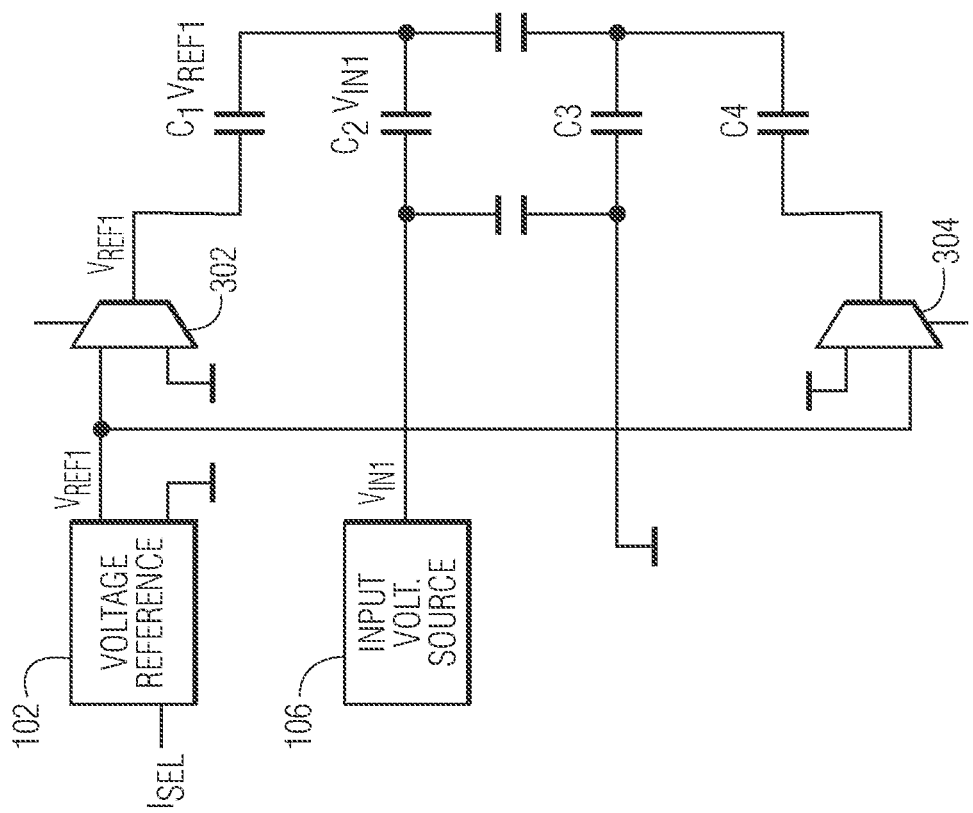
FIG. 14

CIRCUITS AND METHODS FOR VOLTAGE MEASUREMENT

BACKGROUND

Field

This disclosure relates generally to integrated circuits, and more specifically, to an integrated circuit to measure analog voltage signals.

Related Art

Many applications such as metering systems require analog voltage signals to be very accurately measured and represented in digital form. To meet that need, Systems-on-Chip (SoCs) commonly employ a measurement scheme based on using a conventional analog-to-digital converter (ADC) associated with a conventional voltage reference source. Considering state-of-the-art solutions, the final accuracy that can be delivered by such systems is generally constrained by error components associated with the voltage reference signal such as those related to internal device and routing parasitic resistances. Therefore, there is a need to enable higher accuracy in measuring voltage than possible with prior-art solutions.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

FIGS. 5-10 illustrate a schematic diagram showing configurations of the analog front end of the analog to digital converter of FIG. 3 during different phases of operation that can be used in the voltage measurement system of FIG. 1 in accordance with selected embodiments of the invention.

FIGS. 13-15 illustrate a schematic diagram showing configurations of another embodiment of the analog front end of the analog to digital converter of FIG. 3 during different phases of operation that can be used in the voltage measurement system of FIG. 1 in accordance with selected embodiments of the invention.

DETAILED DESCRIPTION

Embodiments disclosed herein provide a voltage measurement system that can include a voltage reference circuit and an analog front end of an analog to digital converter (ADC) with several switches that are controlled in such a manner that error components become cancelled out during the voltage measurement procedure. This is achieved by combining functional characteristics of the voltage reference and the ADC circuits, i.e., leveraging from intrinsic operations that may be performed by each block to minimize error sources, thereby achieving more accurate performance while minimizing the number of additional components needed to achieve the increased accuracy. In addition, the concepts can be used with many different ADC and voltage reference circuit topologies.

Figure 1:
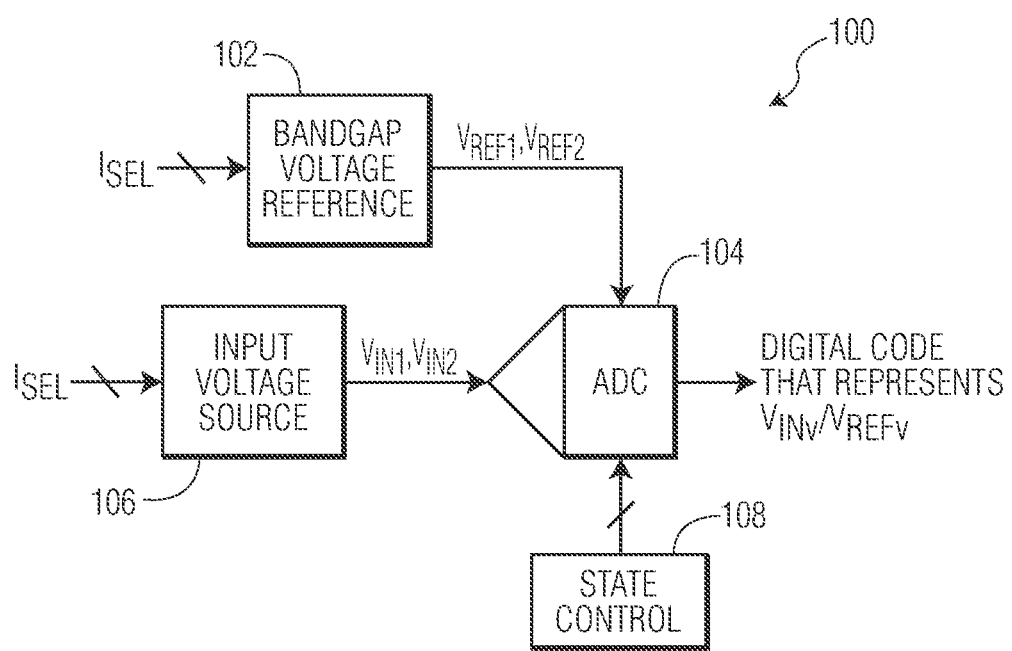
FIG. 1 illustrates a block diagram of components of a voltage measurement system in accordance with selected embodiments of the present invention.

FIG. 1 illustrates a block diagram of components of voltage measurement system 100 in accordance with selected embodiments of the present invention that can include bandgap voltage reference circuit 102, ADC 104, input voltage source 106, and state control circuit 108. Bandgap voltage reference circuit 102 and input voltage source 106 receive a current select signal $I_{SEL}$ that is used to select between first and second reference voltages VREF1, VREF2, from bandgap voltage reference circuit 102, and between first and second input voltages VIN1, VIN2. State control circuit 108 provides signals to control the configuration of ADC 104 during various phases of operation. ADC 104 provides an output in digital code that represents a ratio of the input voltage VINV over the reference voltage VREFV.

During operation, the digital output code represents the ratio VIN/VREFv where VREFv ("virtual" reference voltage) corresponds a reference level calculated as a function of reference voltages VREF1 and VREF2 such that error components associated with parasitic resistances of bipolar transistors Q1 and Q2 (FIG. 2A) are cancelled out. To cancel out mismatch and offset errors, chopping and dynamic element matching (DEM) techniques can be applied by configuring each state to account for device switching and rotation. The term "rotation" is related to the DEM algorithm, where elements of the same kind are used sequentially causing the averaging effect. For example, a set of 8 identical resistors or devices, using only one of them each clock periodically from 1 to 8 and repeating again. These techniques and configurations will be further described below in connection with FIGS. 3-9.

Figure 2A:
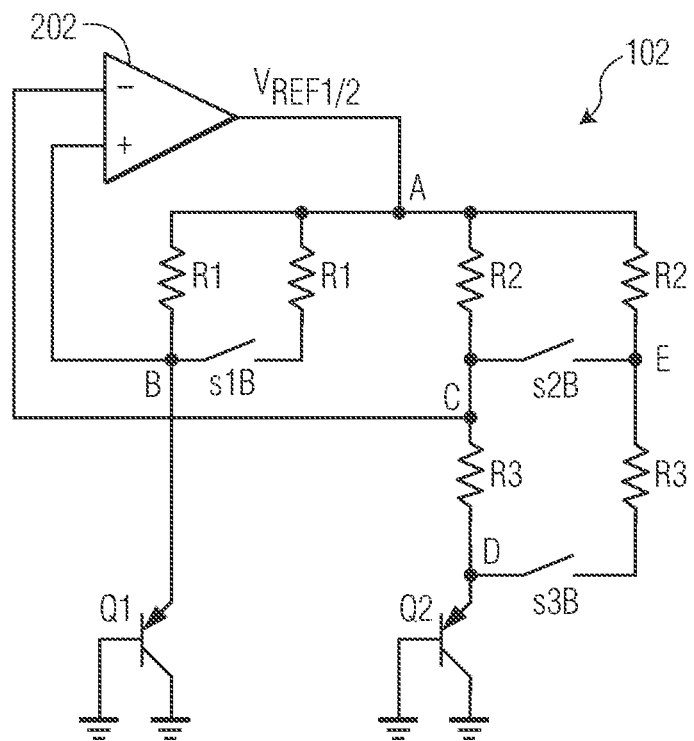
FIG. 2A illustrates a schematic diagram a voltage reference circuit that can be used in the voltage measurement system of FIG. 1 in accordance with selected embodiments of the invention.

FIG. 2A illustrates a schematic diagram of bandgap voltage reference circuit 102 that can be used in the voltage measurement system of FIG. 1 in accordance with selected embodiments of the invention. Bandgap reference voltage circuit 102 includes amplifier 202 with an output coupled to Node A that provides first and second reference voltages VREF1, VREF2 depending on the settings of switches S1B, S2B, S3B. Resistors R11, R12, R21, and R22 include first terminals coupled to Node A. A second terminal of resistor R11 is coupled to Node B. Node B is coupled to a non-inverting input of amplifier 202. A second terminal of resistor R12 is coupled to a first terminal of switch S1B. A second terminal of switch S1B is coupled Node B. Bi-polar junction transistor Q1 includes an emitter coupled to Node B, and a base and a collector coupled to ground. A second terminal of resistor R21 is coupled to Node C. Node C is coupled to an inverting input of comparator 202. A second terminal of resistor R22 is coupled to a first terminal of switch S2B through Node E. A second terminal of switch S2B is coupled Node C. Resistor R31 includes a first terminal coupled to Node C and a second terminal coupled to Node D. Resistor includes a first terminal coupled to Node E and a second terminal coupled to a first terminal of switch S3B. A second terminal of switch S3B is coupled to Node D.

PNP bi-polar junction transistor (BJT) Q1 includes an emitter coupled to Node B, and a base and a collector coupled to ground. PNP bi-polar junction transistor (BJT) Q2 includes an emitter coupled to Node D, and a base and a collector coupled to ground.

In general, bandgap reference circuits generate an output $V_{REF}$ that may be expressed as a linear combination of base-emitter terminal voltages of internal bipolar devices:

$$V_{REF} = \sum_{j=1}^{n} K_j V_{B'E'j}(I_j) \quad \text{(Equation 1)}$$

Where $K_j$ is a design-defined constant and $V_{B'E'j}(I_j)$ is the base-emitter terminal voltage produced by bipolar transistor $Q_j$ biased with collector current $I_j$. For example, n=2, $K_1$=A+1 and $K_2$=(−A) in the common expression $V_{REF}=V_{B'E'1}+A(V_{B'E'1}-V_{B'E'2})$ of simple bandgap references.

Bandgap reference voltage circuit 102 is configurable in a first state and in a second state. In the first state, switches S1, S2, and S3 are open to generate VREF1. In a second state, switches S1, S2, and S3 are closed to generate VREF2. By inspection of FIG. 2A, (Equation 1) continues to hold for VREF1 and VREF2 but BJT collector currents are doubled when switches are closed to generate VREF2 thereby producing different base-emitter voltage values. The difference between these states is that the magnitudes or densities of the bipolar transistor biasing currents in the second state are N times higher than those of the first state as expressed by:

$$V_{REF1} = \sum_{j=1}^{n} K_j V_{B'E'j}(I_j); \quad \text{(Equation 2)}$$

$$V_{REF2} = \sum_{j=1}^{n} K_j V_{B'E'j}(N \cdot I_j)$$

Where $V_{REF1}$ and $V_{REF2}$ is the output generated with bandgap reference voltage circuit 102 configured in the first and second state, respectively.

Figure 11:
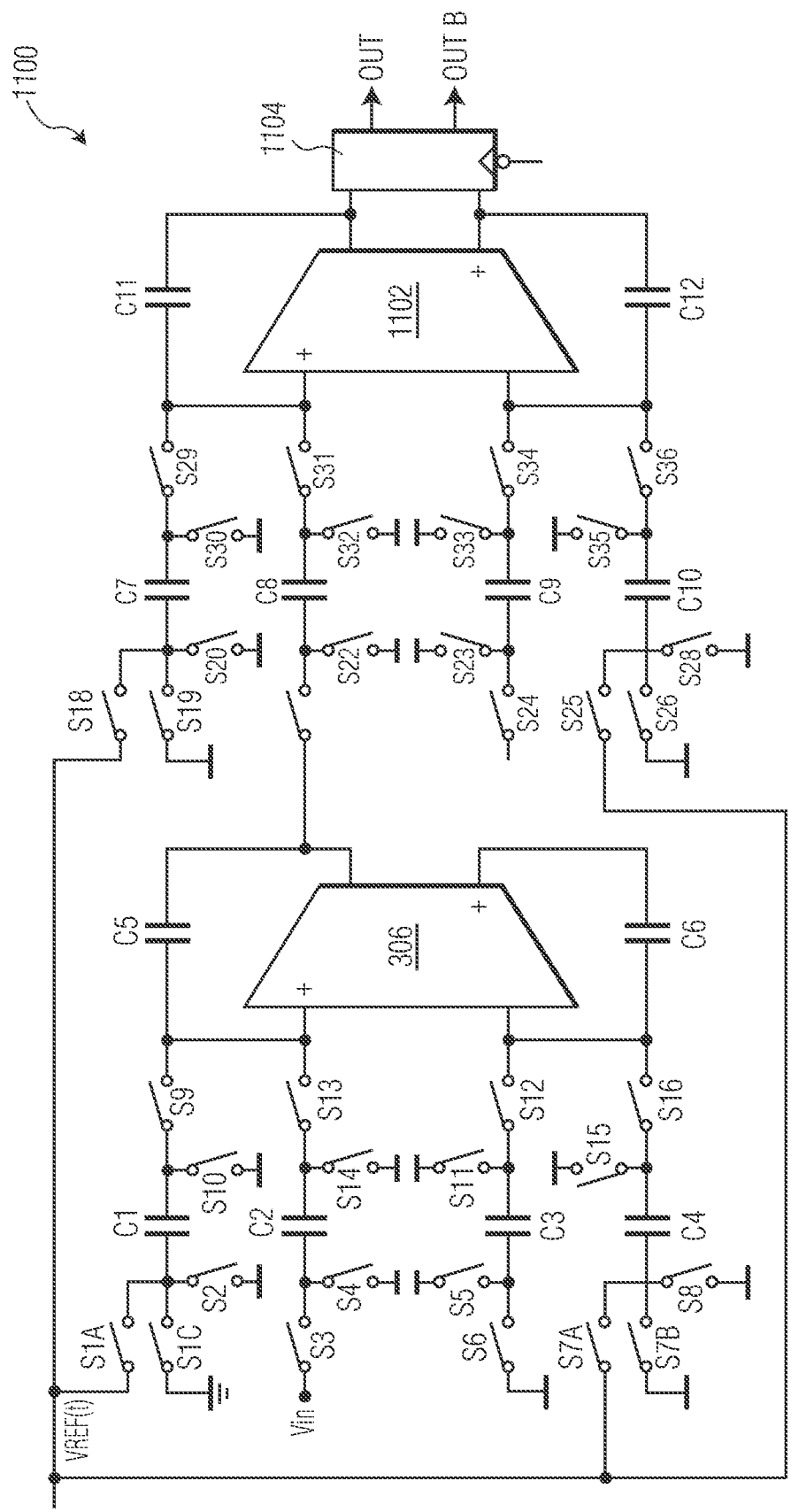
FIG. 11 illustrates a schematic diagram showing a two-stage modulator analog front end of an analog to digital converter that can be used in the voltage measurement system of FIG. 1 in accordance with selected embodiments of the invention.

An example of a time history of settings for switches S1B, S2B and S3B of FIG. 2A is shown in FIG. 11. During a first full cycle of clock signal CK1, the signal driving switches S1B, S2B and S3B is LOW, causing switches S1B, S2B and S3B to be open. The reference voltage output VREF1 of amplifier 202 is at a first value. During a second full cycle of clock signal CK1, the signal driving switches S1B, S2B and S3B is HIGH, causing switches S1B, S2B and S3B to be closed, producing second reference voltage VREF2. Switches S1B, S2B and S3B are alternatingly driven LOW and HIGH on alternating clock cycles.

The cancelling of parasitic resistance effects of BJTs Q1 and Q2 can be performed directly by combining VREF1 and VREF2 as shown in Equation 3:

$$V_{REFv} = \frac{NV_{REF_1} - V_{REF_2}}{N - 1} \quad \text{(Equation 3)}$$

Typically, N=2 and (Equation 3) becomes:

$$V_{REFv} = 2V_{REF1} - V_{REF2} \quad \text{(Equation 4)}$$

In selected embodiments, the operation expressed by (Equation 4) can be performed within ADC 104, as described in connection with FIG. 3.

Figure 2B:
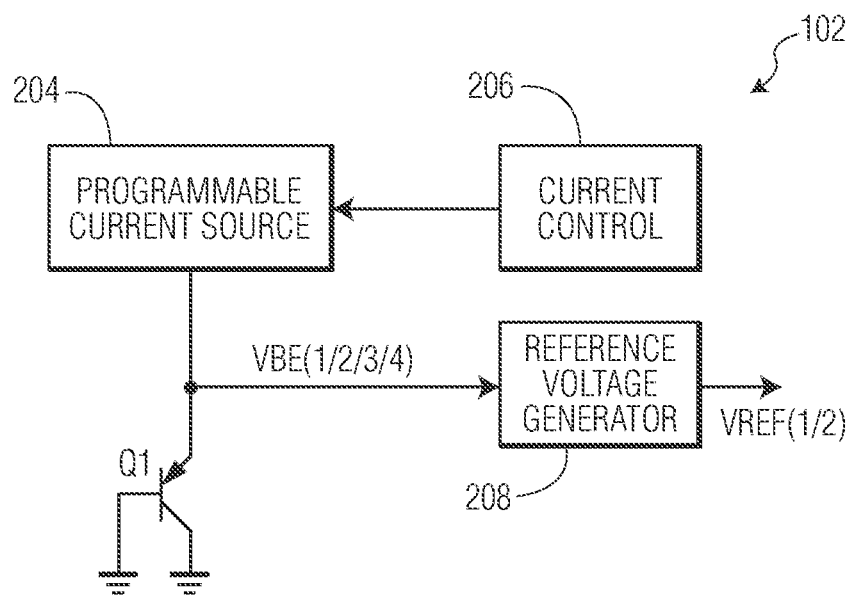
FIG. 2B illustrates a schematic diagram another voltage reference circuit that can be used in the voltage measurement system of FIG. 1 in accordance with selected embodiments of the invention.

FIG. 2B illustrates a schematic diagram another embodiment of bandgap voltage reference circuit 102 that can be used in the voltage measurement system of FIG. 1. Bandgap voltage reference circuit 102 includes programmable current source 204 with an output coupled to the emitter of bipolar transistor Q1. Programmable current source 204 receives a current control signal from current control circuit 206 that indicates a current level or current density to provide to the emitter of transistor Q1. Four different current densities are provided to generate four different base-emitter voltages VBE(1/2/3/4). Reference voltage generator circuit 208 generates the first reference voltage VREF1 based on a difference between the first and second base-emitter voltages VBE(1/2), and the second reference voltage VREF2 based on a difference between the third and fourth base-emitter voltages VBE(3/4). Each of the first reference voltage and the second reference voltage are generated over multiple clock cycles. For example, the first and second base-emitter voltages for the first reference voltage may be obtained during two clock cycles, and the third and fourth base-emitter voltages for the second reference voltage may be obtained during two clock cycles.

Figure 3:
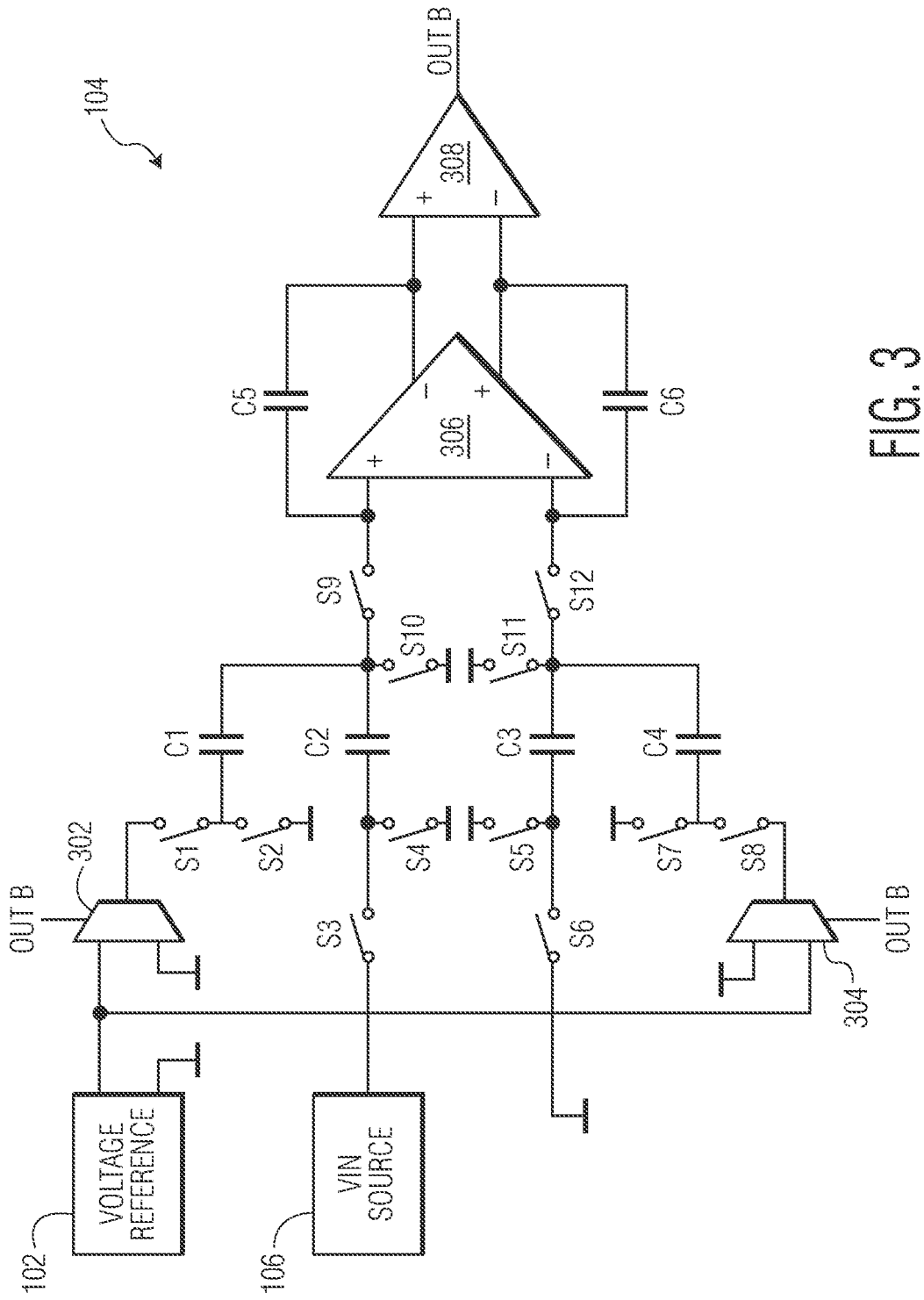
FIG. 3 illustrates a schematic diagram showing an analog front end a single stage analog to digital converter (ADC) that can be used in the voltage measurement system of FIG. 1 in accordance with selected embodiments of the invention.

FIG. 3 illustrates a schematic diagram showing an analog front end of a single stage modulator ADC 104 with a sigma delta topology that can be used in voltage measurement system 100 of FIG. 1 in accordance with selected embodiments of the invention that includes analog multiplexers 302, 304, switches S1-S12, capacitors C1-C4, integrator that includes C5, C6, and amplifier 306, and comparator 308. Amplifier 306 can be an operational transconductance amplifier or other suitable type of amplifier.

An analog signal is sampled with a sampling frequency and subsequently quantized in a multi-level quantizer into a digital signal. This process introduces quantization error noise. The first step in a delta-sigma modulation is delta modulation. In delta modulation the change in the signal (the delta) is encoded, rather than the absolute value. The result is a stream of pulses. In delta-sigma modulation, accuracy of the modulation is improved by passing the digital output through a 1-bit ADC and adding (sigma) the resulting analog signal to the input signal (the signal before delta modulation), thereby reducing the error introduced by the delta modulation. Embodiments of the analog front end extend the typical sigma-delta modulation by adjusting the order of opening and closing switches in the analog front end to eliminate errors introduced by parasitic resistance effects of BJTs Q1 and Q2 in bandgap voltage reference circuit 102 (FIG. 1) as will be further described herein in the description of FIGS. 5-10.

FIG. 3 shows multiplexers 302, 304. Multiplexer 302 includes a first input coupled to the output of bandgap voltage reference circuit 102, a second input coupled to ground and a control input coupled to a bandgap output voltage OUTB generated at the output of comparator 308. Multiplexer 304 includes a first input coupled to ground, a second input coupled to the output of bandgap voltage reference circuit 102, and a control input coupled to a bandgap output voltage OUTB generated at the output of comparator 308. Switches S1 and S2 are coupled in series with switch S1 including a first terminal coupled to the output of multiplexer 302 and a second terminal coupled to a first terminal of switch S2 and a first terminal of capacitor C1. A second terminal of switch S2 is coupled to ground. Switch S3 includes a first terminal coupled to the output of input voltage source 106 and a second terminal coupled to a first terminal of capacitor C2. Switch S4 includes a first terminal coupled to a second terminal of switch S3 and the first terminal of capacitor C2, and a second terminal coupled to ground. Switch S5 includes a first terminal coupled to ground, and a second terminal coupled to a second terminal of switch S6 and the first terminal of capacitor C3. A first terminal of switch S6 is coupled to ground and the second terminal of switch S6 is further coupled to a first terminal of capacitor C3 along with the second terminal of switch S5. Switch S7 includes a first terminal coupled to ground and a second terminal coupled to a first terminal of switch S8 and a first terminal of capacitor C4. The first terminal of switch S8 is also coupled to the first terminal of capacitor C4 and a second terminal of switch S8 is coupled to an output of multiplexer 304.

Switch S9 includes a first terminal coupled to second terminals of capacitors C1 and C2 and to a first terminal of switch S10, and a second terminal coupled to a first input of amplifier 306. Switch S10 further includes a second terminal coupled to ground. Switch S11 includes first terminal coupled to ground and a second terminal coupled to the second terminals of capacitors C3 and C4 and to a first terminal of switch S12. A second terminal of switch S12 is coupled to a negating input of amplifier 306. Capacitor C5 includes a first terminal coupled to the first input of amplifier 306 and a second terminal coupled to a negating output of amplifier 306. Capacitor C6 includes a first terminal coupled to a negating input of amplifier 306 and a second terminal coupled to a non-negating output of amplifier 306. Comparator 308 includes a first input coupled to the negating output of amplifier 306 and a second input coupled to the non-negating output of amplifier 306. The output of comparator 308 is a sequence of output bits, or bitstream, OUTB, that is a digital code for the analog input voltage. The output bits OUTB are provided to multiplexers 302 and 304 and are further used in ADC 104 to condition and provide the digital code for use in various devices such as microprocessors, microcontrollers, and any other device that requires a digital signal that represents an analog voltage input. A digital filter, known as a decimator, can be used in ADC 104 to generate a digital N-bit word from the bitstream.

Figure 4:
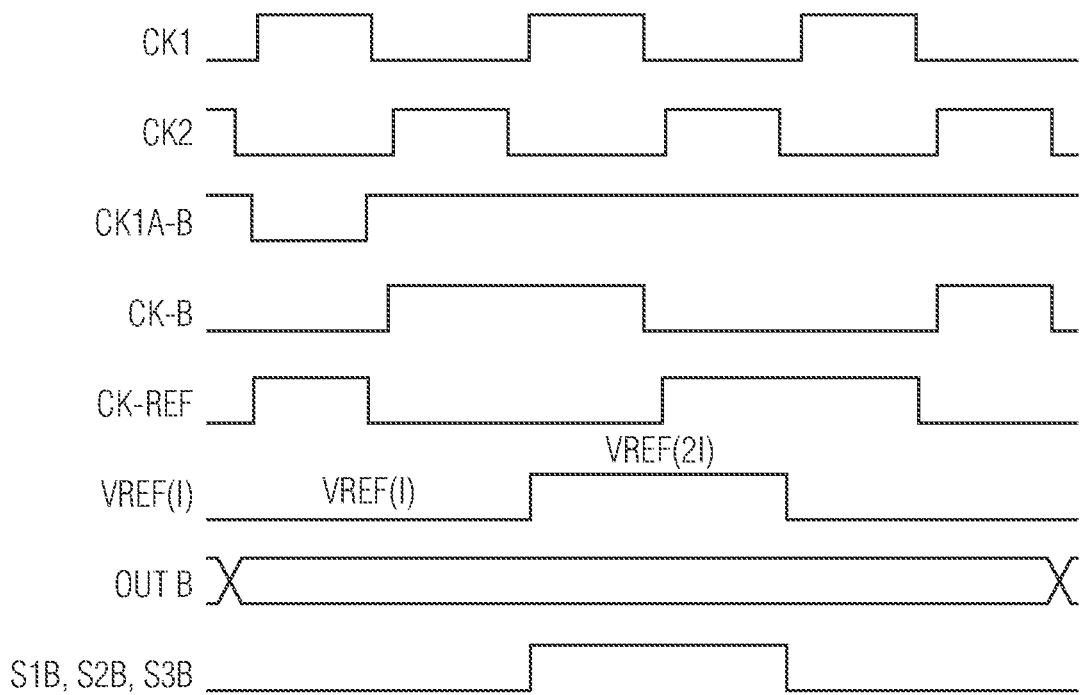
FIG. 4 illustrates time history diagrams for the settings of various signals used to operate switches in the ADC of the voltage measurement system of FIG. 1.

The operation of ADC 104 will be described in connection with FIGS. 3-10. FIG. 4 illustrates time history diagrams for the settings of various signals used to operate switches S1-S12 in ADC 104. Clock signal CK1 is used to operate switches S10 and S11. Clock signal CK2 is used to operate switches S9 and S12. Clock signal CK-B is used to operate switches S1, S3, S6 and S8. Clock signal CK-REF is used to operate switches S2 and S7. Clock signal CK1A-B (the inverse of clock signal CK1A) is used to operate switches S4 and S5. When clock signals CK1, CK2, CK-B, CK-REF and CK1A-B are HIGH, the corresponding switches S1-S12 are closed, connecting components on both sides of the switches to one another. When clock signals CK1, CK2, CK-B, CK-REF and CK1A-B are LOW or not asserted, the corresponding switches S1-S12 are open, disconnecting components on both sides of the switches from one another.

FIGS. 5-10 illustrates a schematic diagram showing configurations of ADC 104 of FIG. 3 during different phases of operation based on the signals used to control operation of switches S1-S12 shown in FIG. 4 that can be used in voltage measurement system 100 of FIG. 1 in accordance with selected embodiments of the invention.

FIG. 5 shows a configuration of ADC 104 in which VREF1 and VIN1 are sampled in ADC 104. Clock signals CK1 and CK-REF are asserted and clock signals CK2, CK1A-B, and CK-B remain de-asserted. Switches S1, S3, S6, S8, S10, and S11 are closed, and switches S2, S4, S5, S7, S9, and S12 are open. Capacitor C1 is charged to C1*VREF1, capacitor C2 is charged to C2*VIN1, capacitor C3 is connected to ground, and capacitor C4 is charged to C4*VREF1.

Figure 6:
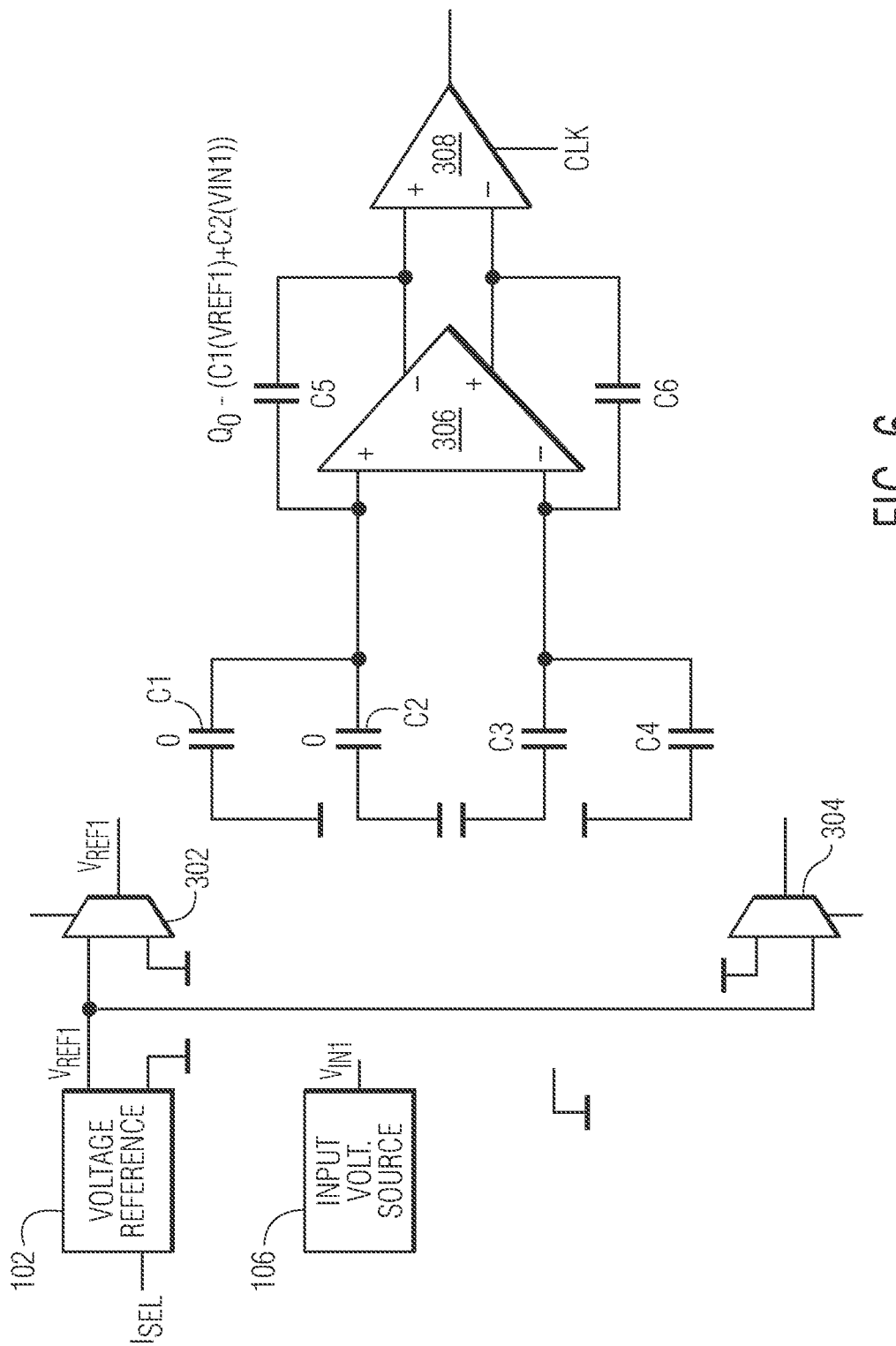

FIG. 6 shows a configuration of ADC 104 in which the charge on capacitors C1 and C2 is combined and stored in capacitor C5. Clock signals CK1 and CK-REF are not asserted and clock signals CK2, CK1A-B, and CK-B are asserted. Switches S2, S4, S5, S7, S9 and S12 are closed, and switches S1, S3, S6, S8, S10 and S11 are open. The charge transferred to capacitor C5 is Qo=(C1*VREF1+C2*VIN1) while charge on capacitor C6 remains unchanged because capacitors C3 and C4 are both coupled to ground.

Figure 7:
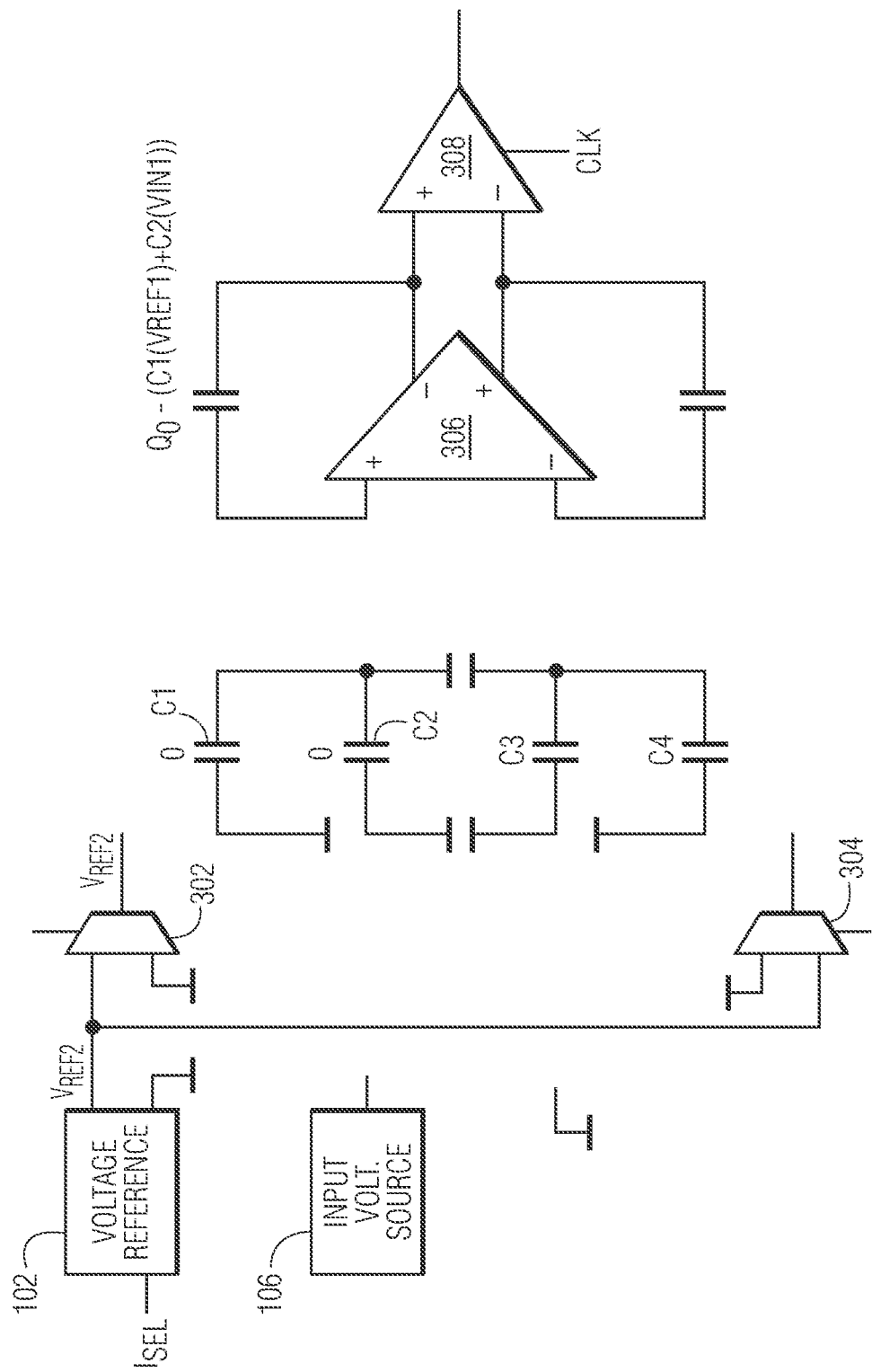

FIG. 7 shows a configuration of ADC 104 in which capacitors C1 and C2 are discharged in ADC 104. Clock signals CK1, CKB and CK1A-B are asserted and clock signals CK2 and CK-REF are not asserted. Switches S2, S4, S5, S7, S10, and S11 are closed, and switches S1, S3, S6, S8, S9 and S12 are open. Capacitors C1, C2, C3 and C4 are connected to ground and discharged. The charge on capacitor C5 remains Qo=(C1*VREF1+C2*VIN1).

Figure 8:
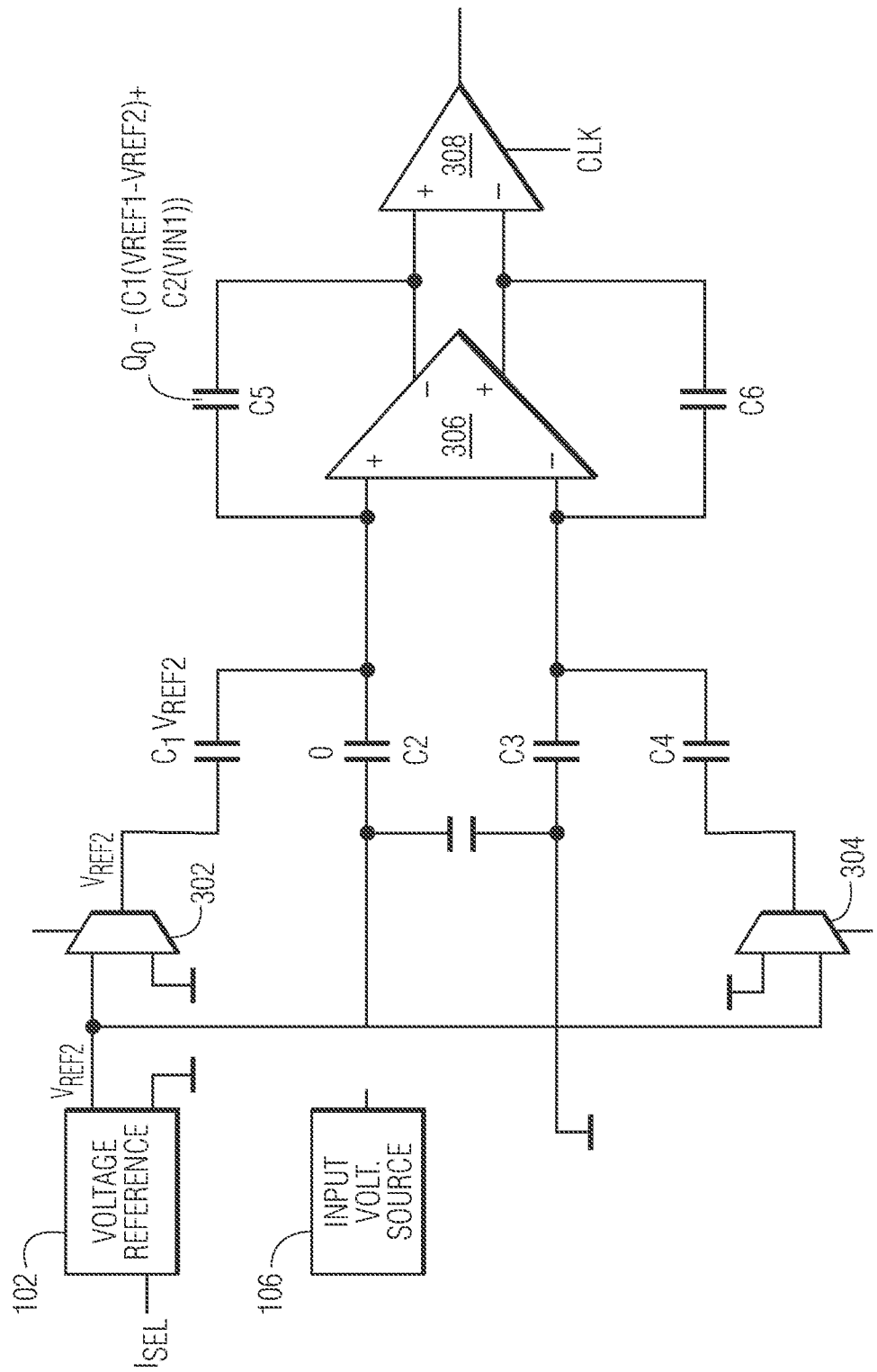

FIG. 8 shows a configuration of ADC 104 in which VREF2 and VIN2 are sampled and the charge on capacitors C1 and C2 is added to the charge on capacitor C5 in ADC 104. Clock signals CK2, CK1A-B and CK-REF are asserted and clock signals CK1 and CK-B are not asserted, causing switches S1, S3, S4, S5, S6, S8, S9, and S12 to be closed, and switches S2, S7, S10, and S11 to be open. Capacitors C1 and C4 are charged to C1*VREF2 and C4*VREF2, and capacitor C3 is connected to ground. The charge on capacitor C5 becomes Qo=(C1(VREF1−VREF2)+C2(VIN1)).

Figure 9:
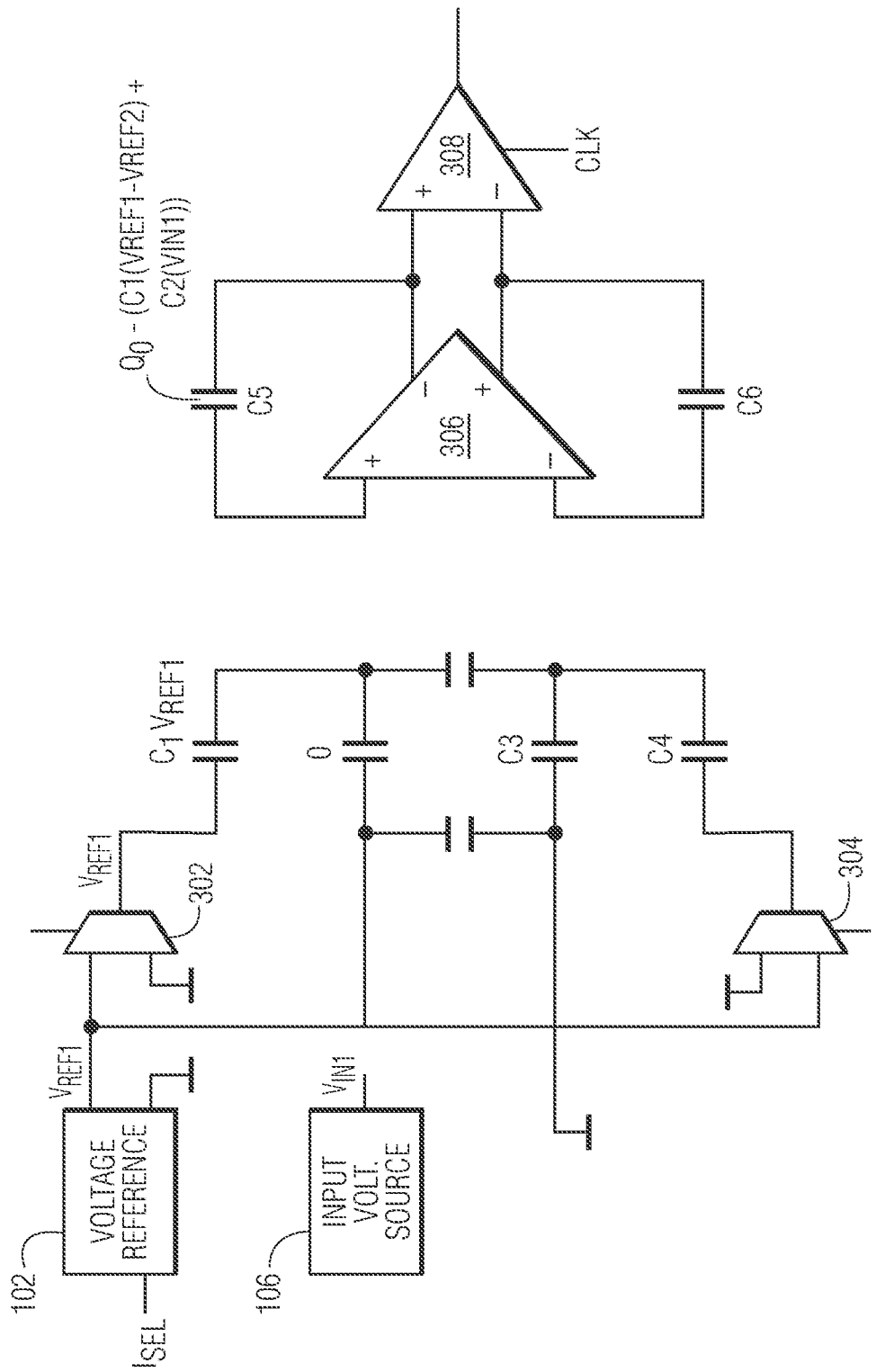

FIG. 9 shows a configuration of ADC 104 in which VREF1 and VIN1 are sampled. Clock signals CK1, CK1A-B and CK-REF are asserted and clock signals CK2 and CK-B are not asserted, causing switches S1, S3, S4, S5, S6, S8, S10, and S11 to be closed, and switches S2, S7, S9, and S12 to be open. Capacitors C1 and C4 are charged to C1*VREF1 and C4*VREF1, respectively, and capacitor C3 is connected to ground. The charge on capacitor C5 remains Qo=C1(VREF1−VREF2)+C2(VIN1).

Figure 10:
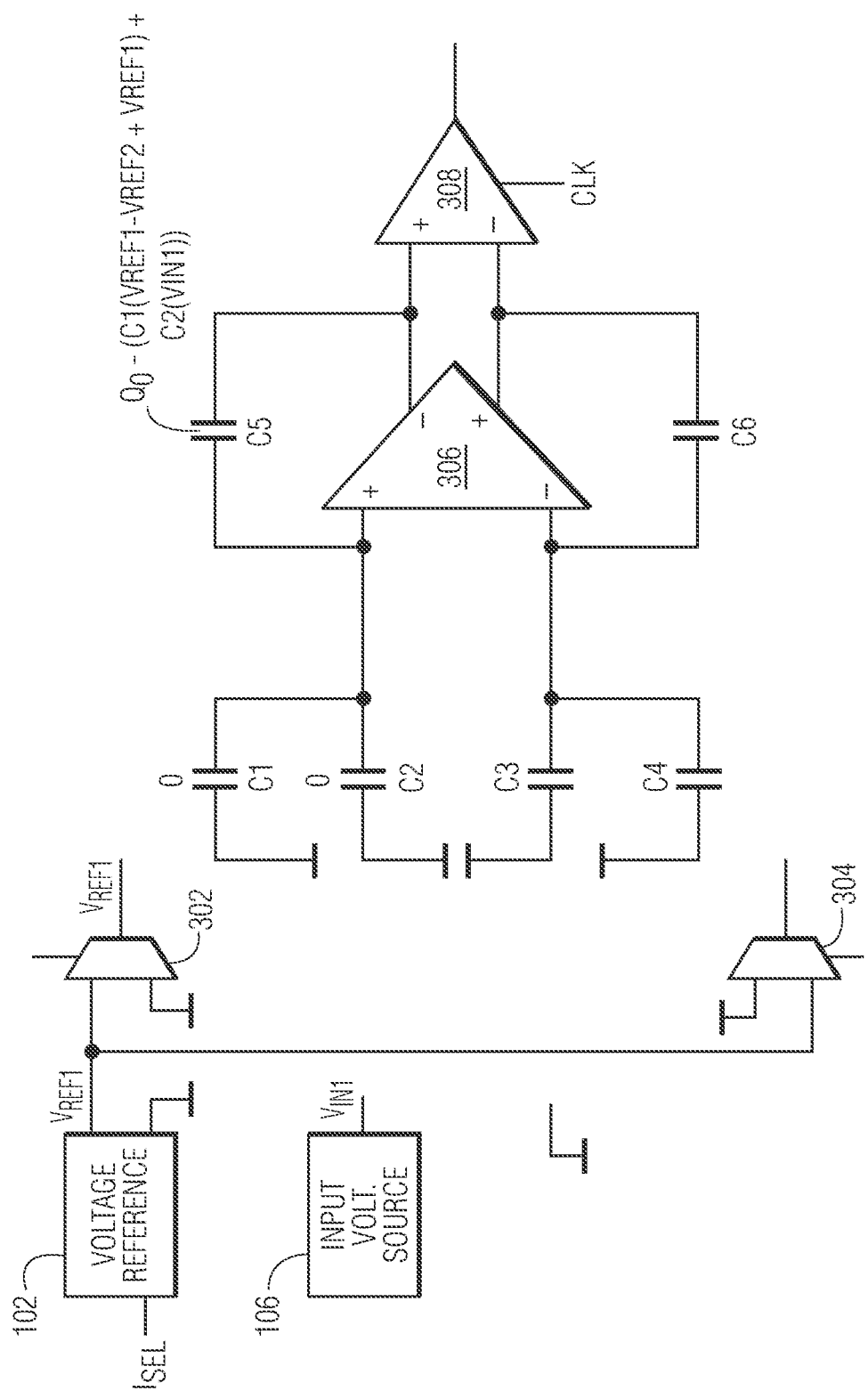

FIG. 10 shows a configuration of ADC 104 in which the charge on capacitors C1 and C2 is combined and stored in capacitor C5. Clock signals CK1 and CK-REF are not asserted and clock signals CK2, CK1A-B, and CK-B are asserted. Switches S2, S4, S5, S7, S9 and S12 are closed, and switches S1, S3, S6, S8, S10 and S11 are open. The charge transferred to capacitor C5 is Qo=(C1(VREF1−

VREF2+VREF1)+C2(VIN1)) while charge on capacitor C6 remains unchanged because capacitors C3 and C4 are both coupled to ground.

In a conventional sigma-delta ADC, the output OUTB is generated as a function of VIN and VREF. In the embodiments shown in FIGS. 3-10, the new sequence of ADC configurations results in OUTB being generated as function of VIN(i) and VREF(i) instead of VREF and VIN alone. Hence, a "virtual" reference is synthetized within the front end of ADC 104 and the final measurement result is equivalent to that obtained with a reference level not affected by parasitic resistance effects of BJTs Q1 and Q2 (FIG. 2A).

FIG. 11 illustrates a schematic diagram showing an analog front end of a two-stage ADC 1100 that can be used in the voltage measurement system 100 of FIG. 1 in accordance with selected embodiments of the invention. A first stage of the front end of the ADC includes switches S1 through S16, capacitors C1 through C6, an integrator that includes capacitors C5, C6, and amplifier 306. A second stage of the front end of the ADC includes switches S18 through S36, capacitors C7 through C12, a second integrator that includes capacitors C11, C12, and amplifier 1102.

In the first stage of the front end of ADC 104, switch S1A includes a first terminal coupled to the reference voltage VREF(t) output by bandgap voltage reference circuit 102, a second terminal coupled to a first terminal of capacitor C1 and a first terminal of switch S2, and is controlled by the clock signal CK-B and output signal OUT generated by output circuit 1104. Switch S1C includes a first terminal coupled to ground, a second terminal coupled to a first terminal of capacitor C1 and the first terminal of switch S2, and is controlled by the clock signal CK-B and the complement of the output signal OUTB generated by output circuit 1104, which can be implemented using a latched comparator, for example. Switch S2 further includes a second terminal coupled to ground and is controlled by clock signal CK-REF. Switch S3 includes a first terminal coupled to input voltage VIN(t), a second terminal coupled to a first terminal of capacitor C3, and is controlled by clock signal CK-B. Switch S4 includes a first terminal coupled to the second terminal of switch S3 and the first terminal of capacitor C2, and a second terminal coupled to ground. Switch S5 includes a first terminal coupled to ground, and a second terminal coupled to a second terminal of switch S6 and first terminal of capacitor C3. A first terminal of switch S6 is coupled to ground. Switch S8 is controlled by clock signal CK-REF and includes a first terminal to second terminals of switches S7A and S7B. The first terminal of switch S8 is further coupled to the first terminal of capacitor C4 and a second terminal of switch S8 is coupled to ground. Switch S7A includes a first terminal coupled to reference voltage VREF(t) and is controlled by clock signal CK-B the output signal OUT generated by output circuit 1104. Switch S7B includes a first terminal coupled to ground and is controlled by the clock signal CK-B and the complement of the output signal OUTB generated by output circuit 1104.

Switch S9 is controlled by clock signal CK2 and includes a first terminal coupled to a second terminal of capacitor C1 and to a first terminal of switch S10, a second terminal coupled to a first input of amplifier 306. Switch S10 is controlled by clock signal CK1 and further includes a second terminal coupled to ground. Switch S11 is controlled by clock signal CK1A and includes first terminal coupled to ground and a second terminal coupled to the second terminal of capacitor C3 and to a first terminal of switch S12. A second terminal of switch S12 is coupled to a negating input of amplifier 306. Switch S12 is controlled by clock signal CK2A. Switch S15 is controlled by clock signal CK1 and includes a first terminal coupled to ground and a second terminal coupled to the second terminal of capacitor C4 and a first terminal of switch S16. Switch S16 is controlled by clock signal CK2 and includes a second terminal coupled to a first terminal of capacitor C6 and the negating input of amplifier 306. Capacitor C5 includes a first terminal coupled to the first input of amplifier 306 and a second terminal coupled to a negating output of amplifier 306. Capacitor C6 includes a first terminal coupled to the negating input of amplifier 306 and a second terminal coupled to a non-negating output of amplifier 306.

In the second stage of the front end of ADC 104, switch S18 includes a first terminal coupled to the reference voltage VREF(t) output by bandgap voltage reference circuit 102, a second terminal coupled to a first terminal of capacitor C7 and a first terminal of switch S20, and is controlled by the clock signal CK-B and output signal OUT generated by output circuit 1104. Switch S19 includes a first terminal coupled to ground, a second terminal coupled to a first terminal of capacitor C7 and the first terminal of switch S20, and is controlled by the clock signal CK-B and the complement of the output signal OUTB generated by output circuit 1104. Switch S20 further includes a second terminal coupled to ground and is controlled by clock signal CK-REF. Switch S21 includes a first terminal coupled to input voltage VIN(t), a second terminal coupled to a first terminal of capacitor C9, and is controlled by clock signal CK-B. Switch S22 includes a first terminal coupled to the second terminal of switch S21 and the first terminal of capacitor C8, and a second terminal coupled to ground. Switch S23 includes a first terminal coupled to ground, and a second terminal coupled to a second terminal of switch S24 and first terminal of capacitor C9. A first terminal of switch S24 is coupled to ground. Switch S28 is controlled by clock signal CK-REF and includes a first terminal to second terminals of switches S25 and S26. The first terminal of switch S28 is further coupled to the first terminal of capacitor C10 and a second terminal of switch S28 is coupled to ground. Switch S25 includes a first terminal coupled to reference voltage VREF(t) and is controlled by clock signal CK-B the output signal OUT generated by output circuit 1104. Switch S26 includes a first terminal coupled to ground and is controlled by the clock signal CK-B and the complement of the output signal OUTB generated by output circuit 1104.

Switch S29 is controlled by clock signal CK2 and includes a first terminal coupled to a second terminal of capacitor C7 and to a first terminal of switch S30, a second terminal coupled to a first input of comparator 1102. Switch S30 is controlled by clock signal CK1 and further includes a second terminal coupled to ground. Switch S33 is controlled by clock signal CK1A and includes first terminal coupled to ground and a second terminal coupled to the second terminal of capacitor C9 and to a first terminal of switch S34. A second terminal of switch S34 is coupled to a negating input of amplifier 1102. Switch S34 is controlled by clock signal CK2A. Switch S35 is controlled by clock signal CK1 and includes a first terminal coupled to ground and a second terminal coupled to the second terminal of capacitor C10 and a first terminal of switch S36. Switch S36 is controlled by clock signal CK2 and includes a second terminal coupled to a first terminal of capacitor C12 and the negating input of amplifier 1102. Capacitor C11 includes a first terminal coupled to the first input amplifier 1102 and a second terminal coupled to a negating output of amplifier 1102. Capacitor C12 includes a first terminal coupled to the negating input of amplifier 1102 and a second terminal coupled to a non-negating output of amplifier 1102.

Figure 12:
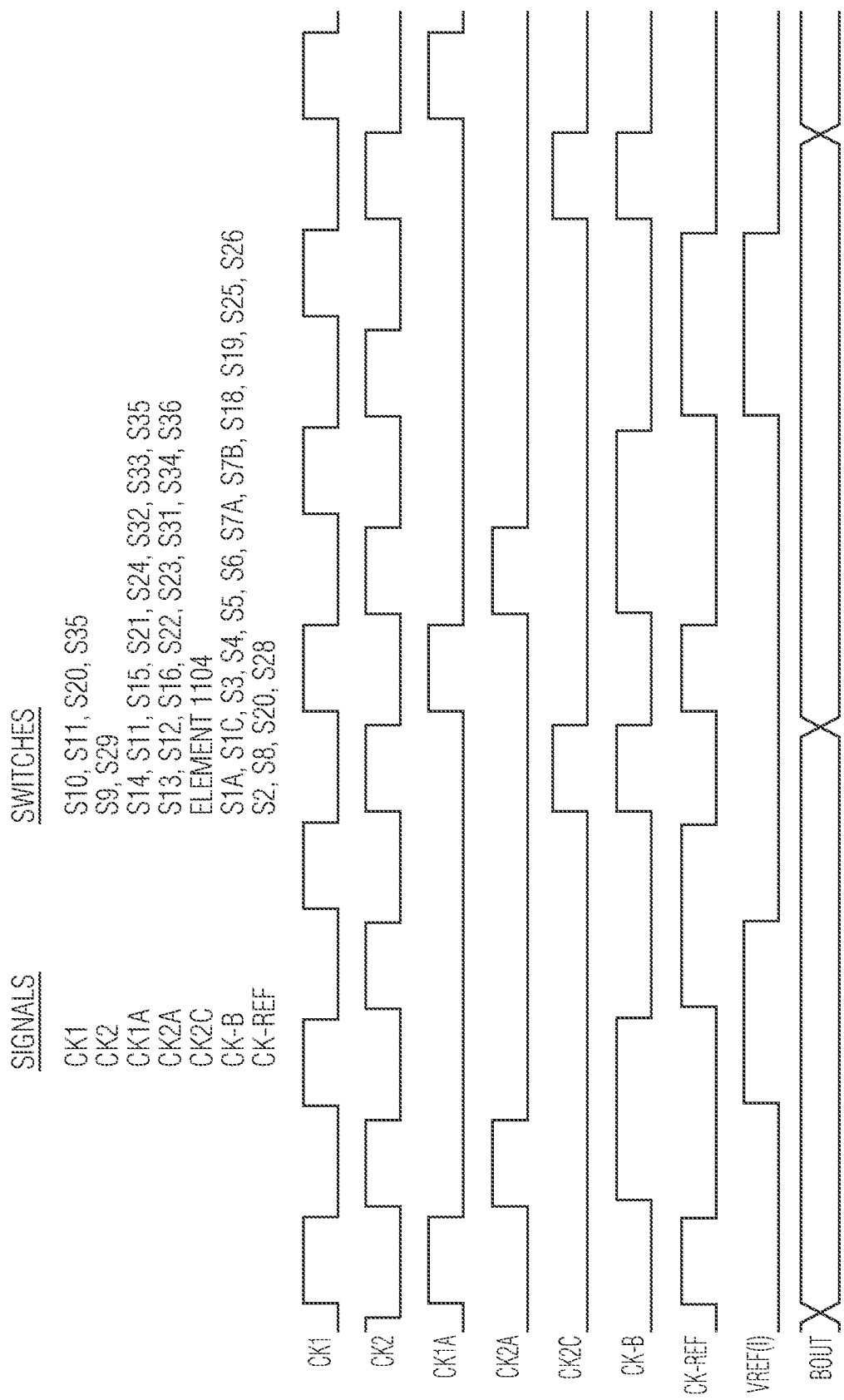
FIG. 12 illustrates time history diagrams for the settings of various signals used to operate switches in the analog to digital converter, and the resulting reference voltage from the voltage measurement system, of FIG. 11.

FIG. 12 illustrates time history diagrams for the settings of various signals used to operate switches S1A through S36 in the front end of two-stage ADC 1100. The resulting reference voltage VREF(I) is shown at the level of VREF(I) during first, third, fourth and sixth complete cycles of clock signal CK1, at the level of VREF(21) during second and fifth complete cycles of clock signal CK1. The switches of ADC 1100 operate in a similar fashion to the sequence shown for single stage front end of ADC 104 in FIGS. 5-10 with the addition of clock signals CK2A and CK2C. In particular, at the end of the third and sixth clock cycles, the charge on capacitor C5 and C11 is Qo=(C1(VREF1−VREF2+VREF1)+C2(VIN1)). This combination of voltages with lower and higher current densities for VREF1, VREF2, VIN1 removes the inaccuracies in the reference voltages, resulting in a more accurate performance of ADC 104.

Bandgap voltage reference circuit 102 as described for FIGS. 1 and 2 is used to compensating error sources related to VREF generation by generating a "virtual reference" VREFv=(VREF1−VREF2+VREF1) to remove errors from the charge stored on capacitor C5. In some cases, input voltage source circuit 106 that generates input voltage VIN can also be modified, in a similar manner as bandgap reference circuit 102, to generate VIN1, VIN2, and "virtual input" VINv=VIN1−VIN2−VIN1.

Figure 13:
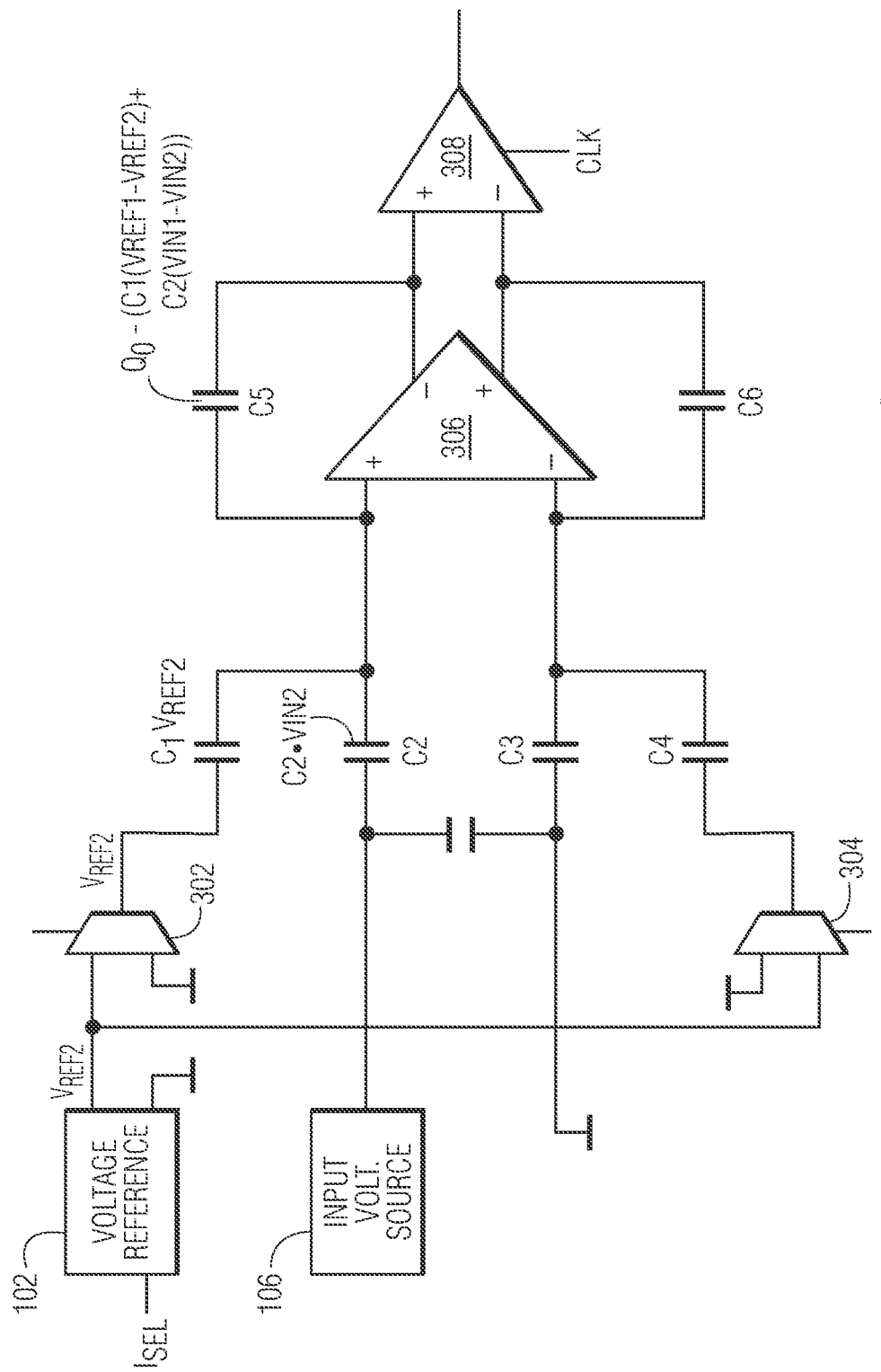
Figure 15:
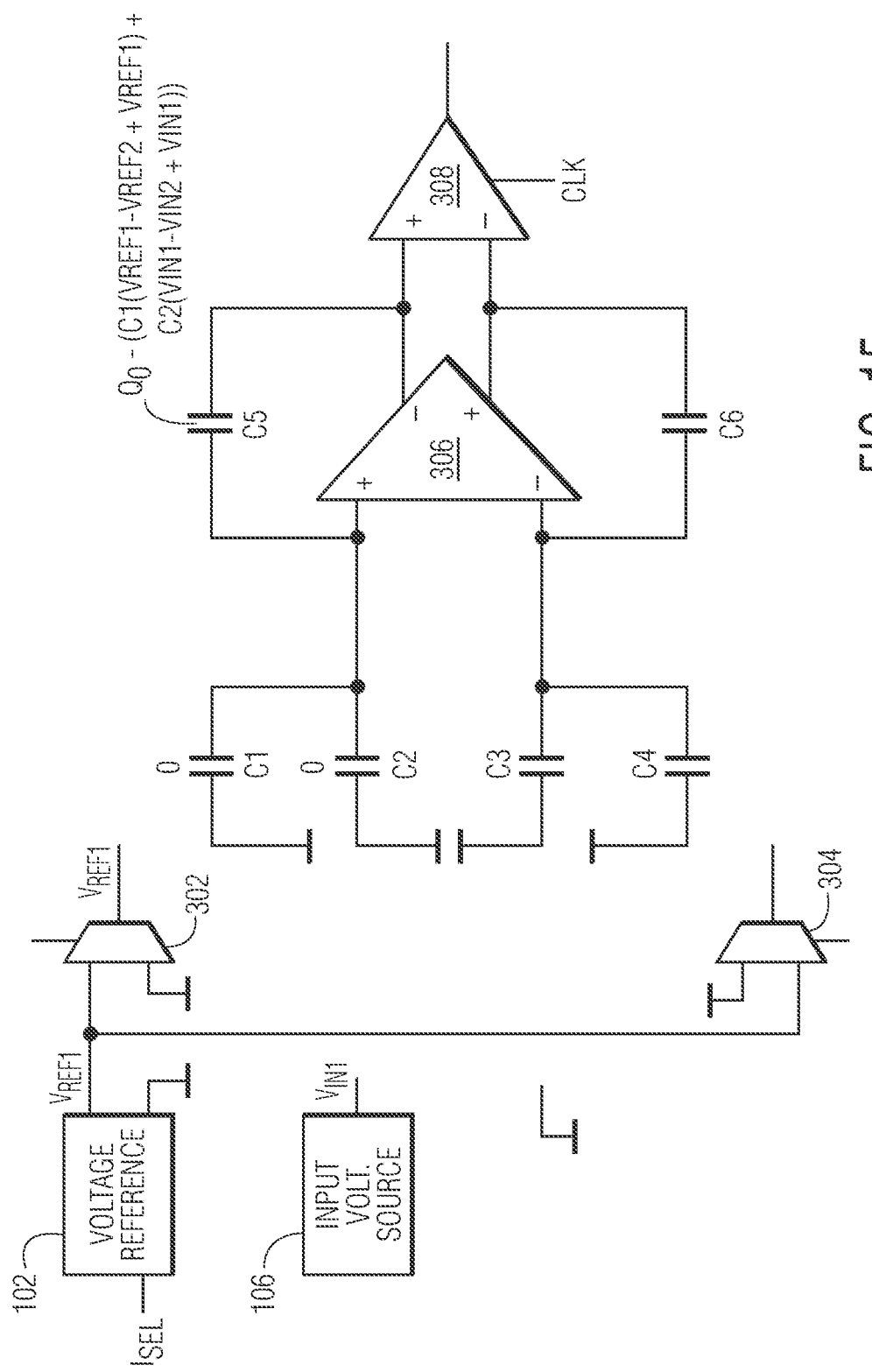

FIGS. 13-15 illustrate a schematic diagram showing configurations of another embodiment of an analog front end of analog to digital converter 104 of FIG. 3 during different phases of operation that can be used in the voltage measurement system of FIG. 1 in accordance with selected embodiments of the invention. FIGS. 13-15 correspond to stages of operation similar to those shown in FIGS. 8, 9 and 10, the difference being the addition of VINv along with VREFv. The beginning stages of operation shown in FIGS. 5, 6 and 7 are the same for embodiments of FIGS. 8-10 as well as 13-15. In FIG. 13, the charge on capacitor C2 is C2(VIN2). During the cycle of operation shown in FIG. 14, the equation for the charge on capacitor C5 is Qo=C1 (VREF1−VREF2+VREF1)+C2(VIN1−VIN2). During the cycle of operation shown in FIG. 15, the equation for the charge on capacitor C5 is Qo=C1(VREF1−VREF2+VREF1)+C2(VIN1−VIN2−VIN1).

Generation of a "virtual input voltage" VINv is optional and may not be possible, depending on the nature of input voltage source 106. When not done, VIN is simply sampled once per cycle and the charge equation becomes Qo=C1 (VREF1−VREF2+VREF1)+C2*VIN. Note there is no VIN1 and VIN2 in this case, just VIN. In other cases (e.g. temperature sensors), the circuit that generates VIN can also be modified, in a similar manner as bandgap voltage reference circuit 102, to generate VIN1, VIN2, and resulting "virtual input voltage" VINv of (VIN1−VIN2−VIN1).

Figure 16:
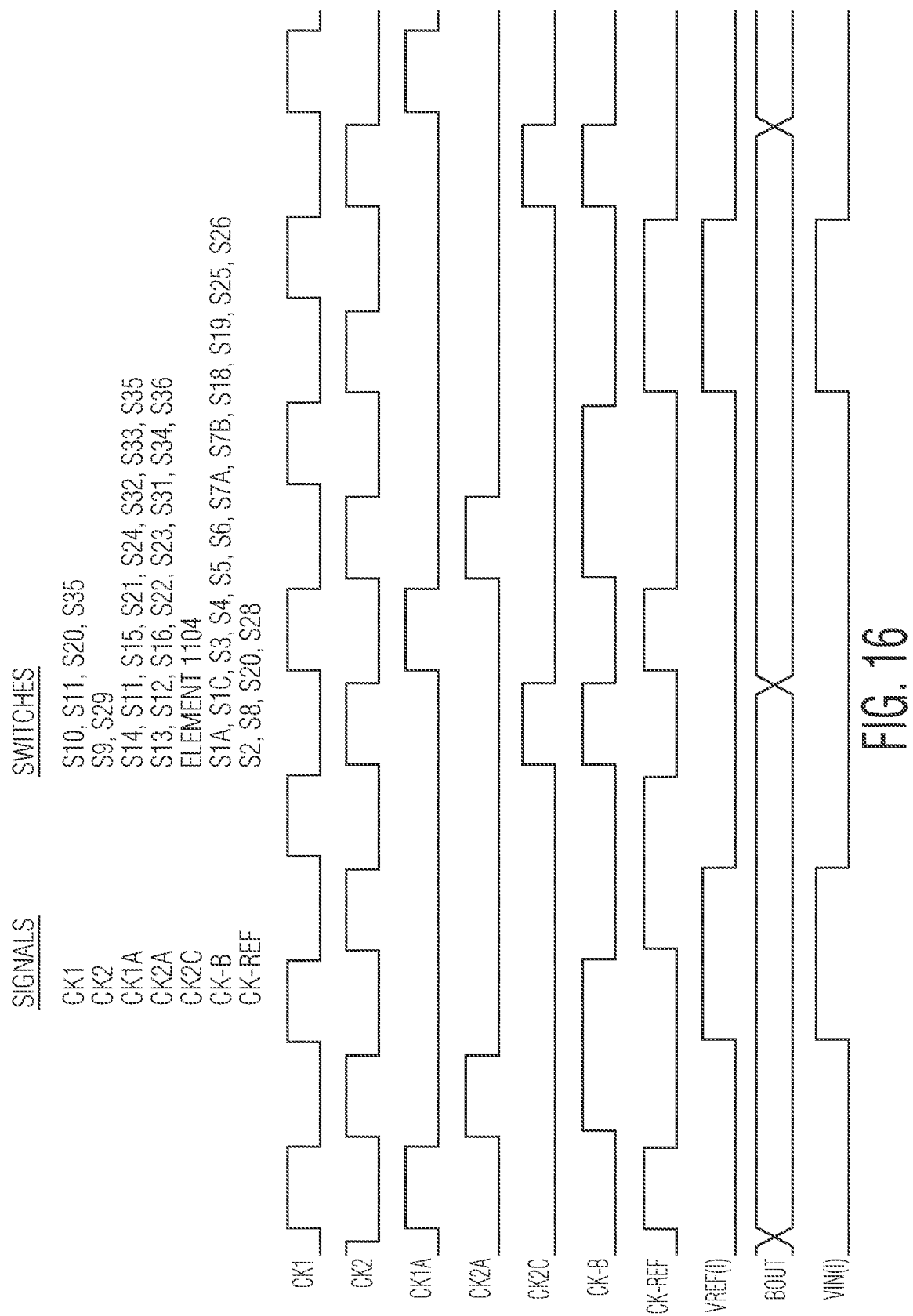
FIG. 16 illustrates time history diagrams for the settings of various signals used to operate switches in an analog to digital converter using the analog front end shown in FIGS. 13-15, and the resulting reference voltage from the voltage measurement system, of FIG. 11.

FIG. 16 illustrates time history diagrams for the settings of various signals used to operate switches in an analog to digital converter using the analog front end shown in FIGS. 13-15, and the resulting reference voltages and input voltages from the voltage measurement system, of FIG. 11. The resulting reference voltage VREF(I) is shown at the level of VREF(I) during first, third, fourth and sixth complete cycles of clock signal CK1, at the level of VREF(21) during second and fifth complete cycles of clock signal CK1. The resulting input voltage source VIN(1) is shown at the level of VIN(1) during first, third, fourth and sixth complete cycles of clock signal CK1, at the level of VIN(21) during second and fifth complete cycles of clock signal CK1. The switches of ADC 1100 operate in a similar fashion to the sequence shown for single stage front end of ADC 104 in FIGS. 5-10 with the addition of clock signals CK2A and CK2C. In particular, at the end of the third and sixth clock cycles, the charge on capacitor C5 and C11 is Qo=(C1(VREF1−VREF2+VREF1)+C2(VIN1−VIN2−VIN1)). This combination of voltages with lower and higher current densities for VREF1, VREF2, VIN1 and VIN2 removes the inaccuracies in the reference voltages, resulting in a more accurate performance of ADC 104.

By now it should be appreciated that in selected embodiments, there has been provided an integrated circuit that can comprise an analog-to-digital converter (ADC) configured to receive a first input voltage, a first reference voltage, and a second reference voltage, and configured to output a digital code which represents a ratio between the first input voltage and a reference voltage (VREFv) which is based on both the first and the second reference voltages. The first and second reference voltages are generated by a reference generator using different current densities. A control circuit can be configured to control switching within the ADC, such that during a first stage, the ADC samples the first input voltage (VIN1) and the first reference voltage (VREF1) and transfers equivalent charge of the sampled first input voltage and first reference voltage (C1*VREF1+C2*VIN1) to an integration capacitor. During a second stage, the ADC samples the second reference voltage (−VREF2) and transfers equivalent charge of the sampled second reference voltage (−C1(VREF2)) to the integration capacitor. The ADC provides one bit of the digital code based on a total charge stored on the integration capacitor after the transfers of charge of the sampled first input voltage, the sampled first reference voltage, and the sampled second reference voltage.

In another aspect, the control circuit controls switching in the ADC such that during a third stage, the ADC again samples the first reference voltage (VREF1) and transfers equivalent charge of the again sampled first reference voltage (C1*VREF1) to the integration capacitor, wherein the ADC provides the one bit of the digital code based on the total charge stored on the integration capacitor after the transfers of charge of the sampled first input voltage, the sampled first reference voltage, the sampled second reference voltage, and the again sampled first reference voltage.

In another aspect, the first, second, and third stages occur consecutively, but occur in any order.

In another aspect, the reference voltage (VREFv) can be based on both the first and the second reference voltages results from completing at least the first stage and the second stage in the ADC.

In another aspect, the reference generator can further comprise a pair of bipolar transistors, wherein the reference generator generates the first reference voltage based on a difference between base-emitter voltages of the pair of bipolar transistors using first current densities through each bipolar transistor of the pair of bipolar transistors, and the reference generator generates the second reference voltage based on a difference between base-emitter voltages of the pair of bipolar transistors using second current densities, different from the first current densities, though each bipolar transistor of the pair of bipolar transistors.

In another aspect, the reference generator can further comprise a bipolar transistor, and the reference generator generates the first reference voltage based on a difference between a first base-emitter voltage of the bipolar transistor using a first current density and a second base-emitter voltage of the bipolar transistor using a second current density. The reference generator generates the second reference voltage based on a difference between a third base-emitter voltage of the bipolar transistor using a third current density and a fourth base-emitter voltage of the bipolar transistor using a fourth current density.

In another aspect, the reference generator can generate each of the first reference voltage and the second reference voltage over multiple clock cycles. The first and second base-emitter voltages for the first reference voltage are obtained during two clock cycles, and the third and fourth base-emitter voltages for the second reference voltage are obtained during two clock cycles.

In another aspect, the control circuit may be configured to control switching within the ADC in accordance with a clock signal. Each of the first stage and the second stage corresponds to multiple clock cycles of the clock signal.

In another aspect, the control circuit may be configured to control switching within the ADC in accordance with a clock signal. Each of the first stage and the second stage may correspond to a clock cycle of the clock signal.

In another aspect, the ADC can be configured to further receive a second input voltage. Each of the first and the second input voltages correspond to different current densities. The control circuit is configured to control switching such that during the second stage, the ADC also samples the second input voltage (−VIN2) and transfers equivalent charge of the sampled second input voltage and the sampled second reference voltage (−C1*VREF2−C2*VIN2) to the integration capacitor, wherein the ADC provides the one bit of the digital code based on the total charge stored on the integration capacitor after the transfers of charge of the sampled first input voltage, the sampled first reference voltage, the sampled second input voltage, and the sample second reference voltage.

In another aspect, the control circuit may be configured to control switching such that during a third stage, the ADC again samples the first reference voltage (VREF1) and again samples the first input voltage (VIN1) and transfers equivalent charge of the again sampled first reference voltage and the again sampled first input voltage (C1*VREF1+C2*VIN1) to the integration capacitor. The ADC provides the one bit of the digital code based on the total charge stored on the integration capacitor after the transfers of charge of the sampled first input voltage, the sampled first reference voltage, the sampled second reference voltage, the again sampled first reference voltage, and the again sample first input voltage.

In another embodiment, a method may comprise providing a first reference voltage and a first input voltage to an analog-to-digital converter (ADC). During a first stage of operation of the ADC, the first input voltage (VIN1) and the first reference voltage (VREF1) are samples and equivalent charge of the sampled first input voltage and first reference voltage (C1*VREF1+C2*VIN1) is transferred to an integration capacitor. A second reference voltage is provided to the ADC. During a second stage of operation of the ADC, the second reference voltage (−VREF2) is sampled and equivalent charge of the sampled second reference voltage (−C1*VREF2) is transferred to the integration capacitor. One bit of a digital code is output by the ADC based on a total charge stored on the integration capacitor after the transfers of charge of the sampled first input voltage, the sampled first reference voltage, and the sampled second reference voltage.

In another aspect, the method may further comprise, during a third stage of operation of the ADC, again sampling the first reference voltage (VREF1) and transferring equivalent charge of the again sampled first reference voltage (C1*VREF1) to the integration capacitor. Outputting the one bit of the digital code is performed such that the one bit of the digital code is based on the total charge stored on the integration capacitor after the transfers of charge of the sampled first input voltage, the sampled first reference voltage, the sampled second reference voltage, and the again sampled first reference voltage.

In another aspect, the method may further comprise providing a second input voltage to the ADC. During the second stage, the second input voltage (−VIN2) is sampled. Equivalent charge of the sampled second input voltage is also transferred (−C1*VREF2−C2*VIN2) to the integration capacitor. The outputting the one bit of the digital code is performed such that the one bit of the digital code based on the total charge stored on the integration capacitor after the transfers of charge of the sampled first input voltage, the sampled first reference voltage, the sampled second input voltage, and the sample second reference voltage.

In another aspect, the providing the first reference voltage may comprise generating the first reference voltage using a first current density, and the providing the second reference voltage comprises generating the second reference voltage using a second current density.

In another aspect, the providing the first reference voltage may comprise generating the first reference voltage based on a difference between base-emitter voltages of a pair of bipolar transistors using first current densities through each bipolar transistor of the pair of bipolar transistors. Providing the second reference voltage may comprise generating the second reference voltage based on a difference between base-emitter voltages of the pair of bipolar transistors using second current densities, different from the first current densities, though each bipolar transistor of the pair of bipolar transistors In further embodiments, an integrated circuit may comprise an analog-to-digital converter (ADC) configured to receive a first input voltage, a first reference voltage, and a second reference voltage, and configured to output a digital code which represents a ratio between the first input voltage and a reference voltage (VREFv) which is based on both the first and the second reference voltages, wherein the first and second reference voltages are generated by a reference generator using different current densities, a control circuit configured to control switching within the ADC, such that during a first stage, the ADC samples the first input voltage (VIN1) and the first reference voltage (VREF1) and accumulates a first charge (Qo=(C1VREF1+C2VIN1)) based on the sampled first input voltage (C2*VIN1) and the sampled first reference voltage (C1*VREF1), and during a second stage, the ADC samples the second reference voltage (−VREF2) and accumulates a second charge (Qo=(C1*VREF1+C2*VIN1−C1*VREF2)) based on the first charge and the sampled second reference voltage (−C1*VREF2). The ADC provides one bit of the digital code based on a total accumulated charge based at least on the second charge.

In another aspect, the control circuit may control switching in the ADC such that during a third stage, the ADC again samples the first reference voltage (VREF1) and accumulates a third charge (Qo=(C1*VREF1+C2*VIN1−C1*VREF2+C1*VREF1)) based on the second charge and the again sampled first reference voltage (C1*VREF1), wherein the one bit of the digital code is provided after the third charge is accumulated, in which the total accumulated charge is based at least on the third charge.

In another aspect, the ADC may be configured to further receive a second input voltage, wherein each of the first and the second input voltages correspond to different current densities, wherein the control circuit controls switching in the ADC such that during the second stage, the ADC also samples the second input voltage (−VIN2), wherein the accumulated second charge (Qo=(C1*VREF1+C2*VIN1−C1*VREF2−C2*VIN2)) is further based on the sampled second input voltage.

In another aspect, the reference voltage (VREFv) based on both the first and the second reference voltages results from completing at least the first stage and the second stage in the ADC.

Because the apparatus implementing the present disclosure is, for the most part, composed of electronic components and circuits known to those skilled in the art, circuit details will not be explained in any greater extent than that considered necessary as illustrated above, for the understanding and appreciation of the underlying concepts of the present disclosure and in order not to obfuscate or distract from the teachings of the present disclosure.

Although the disclosure has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

Although the disclosure is described herein with reference to specific embodiments, various modifications and changes can be made without departing from the scope of the present disclosure as set forth in the claims below. For example, bandgap voltage reference circuit 102 may be implemented using combinations of components other than as shown in FIGS. 2 and 2B. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Semiconductor and other types of electronic devices are often encapsulated wholly or partly in plastic resin to provide environmental protection and facilitate external connection to the devices. For convenience of explanation and not intended to be limiting, the present invention is described for semiconductor devices, but persons of skill in the art will understand that the present invention applies to any type of electronic device that is substantially in chip form. Accordingly, such other types of devices including the non-limiting examples given below, are intended to be included in the terms "device", "electronic device", "semiconductor device" and "integrated circuit" whether singular or plural, and the terms "device", "die" and "chip" are intended to be substantially equivalent. Non-limiting examples of suitable devices are semiconductor integrated circuits, individual semiconductor devices, piezoelectric devices, magnetostrictive devices, solid state filters, magnetic tunneling structures, integrated passive devices such as capacitors, resistors and inductors, and combinations and arrays of any and all of these types of devices and elements. Further, the present invention does not depend upon the types of die or chips being used nor the materials of which they are constructed provided that such materials withstand the encapsulation process.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements.

What is claimed is:

1. An integrated circuit, comprising:
   an analog-to-digital converter (ADC) configured to receive a first input voltage, a first reference voltage, and a second reference voltage, and configured to output a digital code which represents a ratio between the first input voltage and a reference voltage which is based on both the first and the second reference voltages, wherein the first and second reference voltages are generated by a reference generator using different current densities;
   a control circuit configured to control switching within the ADC, such that:
      during a first stage, the ADC samples the first input voltage and the first reference voltage and transfers equivalent charge of the sampled first input voltage and first reference voltage to an integration capacitor;
      during a second stage, the ADC samples the second reference voltage and transfers equivalent charge of the sampled second reference voltage to the integration capacitor,
      wherein the ADC provides one bit of the digital code based on a total charge stored on the integration capacitor after the transfers of charge of the sampled first input voltage, the sampled first reference voltage, and the sampled second reference voltage.

2. The integrated circuit of claim 1, wherein the control circuit controls switching in the ADC such that:
   during a third stage, the ADC again samples the first reference voltage and transfers equivalent charge of the again sampled first reference voltage to the integration capacitor, wherein the ADC provides the one bit of the digital code based on the total charge stored on the integration capacitor after the transfers of charge of the sampled first input voltage, the sampled first reference voltage, the sampled second reference voltage, and the again sampled first reference voltage.

3. The integrated circuit of claim 2, wherein the first, second, and third stages occur consecutively, but occur in any order.

4. The integrated circuit of claim 1, wherein the reference voltage based on both the first and the second reference voltages results from completing at least the first stage and the second stage in the ADC.

5. The integrated circuit of claim 1, wherein the reference generator further comprises:

a pair of bipolar transistors, wherein:
the reference generator generates the first reference voltage based on a difference between base-emitter voltages of the pair of bipolar transistors using first current densities through each bipolar transistor of the pair of bipolar transistors, and
the reference generator generates the second reference voltage based on a difference between base-emitter voltages of the pair of bipolar transistors using second current densities, different from the first current densities, though each bipolar transistor of the pair of bipolar transistors.

6. The integrated circuit of claim 1, wherein the reference generator further comprises a bipolar transistor, wherein:
the reference generator generates the first reference voltage based on a difference between a first base-emitter voltage of the bipolar transistor using a first current density and a second base-emitter voltage of the bipolar transistor using a second current density, and
the reference generator generates the second reference voltage based on a difference between a third base-emitter voltage of the bipolar transistor using a third current density and a fourth base-emitter voltage of the bipolar transistor using a fourth current density.

7. The integrated circuit of claim 6, wherein the reference generator generates each of the first reference voltage and the second reference voltage over multiple clock cycles, wherein:
the first and second base-emitter voltages for the first reference voltage are obtained during two clock cycles, and
the third and fourth base-emitter voltages for the second reference voltage are obtained during two clock cycles.

8. The integrated circuit of claim 7, wherein the control circuit is configured to control switching within the ADC in accordance with a clock signal, wherein each of the first stage and the second stage corresponds to multiple clock cycles of the clock signal.

9. The integrated circuit of claim 1, wherein the control circuit is configured to control switching within the ADC in accordance with a clock signal, wherein each of the first stage and the second stage corresponds to a clock cycle of the clock signal.

10. The integrated circuit of claim 1, wherein the ADC is configured to further receive a second input voltage, wherein each of the first and the second input voltages correspond to different current densities, wherein the control circuit is configured to control switching such that:
during the second stage, the ADC also samples the second input voltage and transfers equivalent charge of the sampled second input voltage and the sampled second reference voltage to the integration capacitor, wherein the ADC provides the one bit of the digital code based on the total charge stored on the integration capacitor after the transfers of charge of the sampled first input voltage, the sampled first reference voltage, the sampled second input voltage, and the sample second reference voltage.

11. The integrated circuit of claim 10, wherein the control circuit is configured to control switching such that:
during a third stage, the ADC again samples the first reference voltage and again samples the first input voltage and transfers equivalent charge of the again sampled first reference voltage and the again sampled first input voltage to the integration capacitor, wherein the ADC provides the one bit of the digital code based on the total charge stored on the integration capacitor after the transfers of charge of the sampled first input voltage, the sampled first reference voltage, the sampled second reference voltage, the again sampled first reference voltage, and the again sample first input voltage.

12. A method comprising:
providing a first reference voltage and a first input voltage to an analog-to-digital converter (ADC);
during a first stage of operation of the ADC, sampling the first input voltage and the first reference voltage and transferring equivalent charge of the sampled first input voltage and first reference voltage to an integration capacitor;
providing a second reference voltage to the ADC;
during a second stage of operation of the ADC, sampling the second reference voltage and transferring equivalent charge of the sampled second reference voltage to the integration capacitor; and
outputting one bit of a digital code by the ADC based on a total charge stored on the integration capacitor after the transfers of charge of the sampled first input voltage, the sampled first reference voltage, and the sampled second reference voltage.

13. The method of claim 12, further comprising:
during a third stage of operation of the ADC, again sampling the first reference voltage and transferring equivalent charge of the again sampled first reference voltage to the integration capacitor, wherein the outputting the one bit of the digital code is performed such that the one bit of the digital code is based on the total charge stored on the integration capacitor after the transfers of charge of the sampled first input voltage, the sampled first reference voltage, the sampled second reference voltage, and the again sampled first reference voltage.

14. The method of claim 12, the method further comprising:
providing a second input voltage to the ADC;
during the second stage, sampling the second input voltage, wherein equivalent charge of the sampled second input voltage is also transferred to the integration capacitor, and wherein the outputting the one bit of the digital code is performed such that the one bit of the digital code based on the total charge stored on the integration capacitor after the transfers of charge of the sampled first input voltage, the sampled first reference voltage, the sampled second input voltage, and the sample second reference voltage.

15. The method of claim 12, wherein:
the providing the first reference voltage comprises generating the first reference voltage using a first current density; and
the providing the second reference voltage comprises generating the second reference voltage using a second current density.

16. The method of claim 12, wherein:
the providing the first reference voltage comprises generating the first reference voltage based on a difference between base-emitter voltages of a pair of bipolar transistors using first current densities through each bipolar transistor of the pair of bipolar transistors, and
the providing the second reference voltage comprises generating the second reference voltage based on a difference between base-emitter voltages of the pair of bipolar transistors using second current densities, different from the first current densities, though each bipolar transistor of the pair of bipolar transistors.

17. An integrated circuit, comprising:
an analog-to-digital converter (ADC) configured to receive a first input voltage, a first reference voltage, and a second reference voltage, and configured to output a digital code which represents a ratio between the first input voltage and a reference voltage which is based on both the first and the second reference voltages, wherein the first and second reference voltages are generated by a reference generator using different current densities;
a control circuit configured to control switching within the ADC, such that:
during a first stage, the ADC samples the first input voltage and the first reference voltage and accumulates a first charge based on the sampled first input voltage and the sampled first reference voltage;
during a second stage, the ADC samples the second reference voltage (•) and accumulates a second charge based on the first charge and the sampled second reference voltage,
wherein the ADC provides one bit of the digital code based on a total accumulated charge based at least on the second charge.

18. The integrated circuit of claim 17, wherein the control circuit controls switching in the ADC such that:
during a third stage, the ADC again samples the first reference voltage and accumulates a third charge based on the second charge and the again sampled first reference voltage, wherein the one bit of the digital code is provided after the third charge is accumulated, in which the total accumulated charge is based at least on the third charge.

19. The integrated circuit of claim 18, wherein the ADC is configured to further receive a second input voltage, wherein each of the first and the second input voltages correspond to different current densities, wherein the control circuit controls switching in the ADC such that:
during the second stage, the ADC also samples the second input voltage, wherein the accumulated second charge is further based on the sampled second input voltage.

20. The integrated circuit of claim 17, wherein the reference voltage based on both the first and the second reference voltages results from completing at least the first stage and the second stage in the ADC.

* * * * *